United States Patent [19]

Bae

[11] Patent Number: 5,766,809
[45] Date of Patent: Jun. 16, 1998

[54] METHOD FOR TESTING OVERLAY IN A SEMICONDUCTOR DEVICE UTILIZING INCLINED MEASURING MARK

[75] Inventor: Sang Man Bae, Ichon, Rep. of Korea

[73] Assignee: Hyundai Electronics Industries Co., Ltd., Kyoungki-do, Rep. of Korea

[21] Appl. No.: 719,069

[22] Filed: Sep. 24, 1996

[30] Foreign Application Priority Data

Sep. 27, 1995 [KR] Rep. of Korea ............... 95-32088

[51] Int. Cl.$^6$ ............................................. G03F 9/00
[52] U.S. Cl. ........................... 430/22; 430/30; 356/399
[58] Field of Search .......................... 430/5, 22, 30; 356/399

[56] References Cited

U.S. PATENT DOCUMENTS

| 5,280,437 | 1/1994 | Corliss | 364/559 |
| 5,438,413 | 8/1995 | Mazor et al. | 356/363 |
| 5,498,500 | 3/1996 | Bae | 430/22 |
| 5,635,336 | 6/1997 | Bae | 430/314 |

Primary Examiner—Christopher G. Young
Attorney, Agent, or Firm—Gary M. Nath; Nath & Associates

[57] ABSTRACT

A method for testing an overlay occurring in a semiconductor device to compensate for an error generated in the measurement of overlay. This method involves forming an inner mark on a semiconductor wafer, and forming an outer mark on the semiconductor wafer in such a fashion that the outer mark is inclined in one direction and has an island portion arranged in the inside of the inner mark and a land portion comprised of a photoresist film pattern formed over the entire surface of the semiconductor wafer while being spaced from the island portion by a desired distance, thereby forming an overlay measuring mark consisting of the inner and outer marks. Measured values of the island and land portions of the inner mark are averaged and then compared with measured values of the outer mark, thereby deriving overlay compensation values. Accordingly, even if the overlay measuring mark is formed in an inclined state, the method can simply measure an inaccuracy in measured overlay value. Even when the overlay correction value varies subsequently due to a variation in conditions of the overlay measuring device or process, an accurate overlay correction value can be derived by conducting the overlay measuring process only once. The overlay margin in the overlay test can increase, thereby achieving an improvement in process yield and operation reliability.

14 Claims, 4 Drawing Sheets

METHOD FOR TESTING OVERLAY IN A SEMICONDUCTOR DEVICE UTILIZING INCLINED MEASURING MARK

BACKGROUND OF THE INVENTION

1. Field of the Invention

The present invention relates to a method for fabricating a semiconductor device, and more particularly to a method for testing an overlay occurring in a semiconductor device to compensate an error generated in the measurement of the overlay, thereby achieving an improvement in process yield and operation reliability.

2. Description of the Prior Art

In the fabrication of semiconductor devices, in particular, highly integrated semiconductor devices, a complex process using a plurality of overlapping light exposure masks is generally used. The layer-to-layer alignment among the light exposure masks used in respective steps of the fabrication process is conducted with respect to a mark having a particular shape.

Such a mark comprises an alignment key or mark used for the layer-to-layer alignment between different masks or alignment between a mask and a die, and an overlay measuring mark used to measure an overlay, namely, overlap accuracy between patterns.

Steppers, which is a step and repeat type illumination device used in the fabrication of semiconductor devices, is a device in which light exposure is conducted as its stage repeatedly performing alignment of a wafer while moving X-Y directions. The stage automatically or manually conducts the alignment of the wafer with reference to an alignment mark.

Since the stage operates mechanically, an error in alignment may occur while the fabrication process is repetitively carried out. When such an alignment error exceeds its allowable range, the semiconductor devices as finally obtained may have poor quality.

The overlay accuracy based on misalignment may be adjusted in accordance with the design rule of the semiconductor device. The adjustment ranges from 20 to 30% of the general design rule.

The overlay accuracy measuring mark or overlay measuring mark are used in the same manner as the alignment mark to check whether layers laminated on a semiconductor substrate are accurately aligned with one another.

Conventionally, such an alignment mark or overlay measuring mark is formed on the scribe line of a wafer where no chip is disposed.

The measurement of misalignment using alignment marks is carried out in accordance with either a visual checking method using vernier alignment marks or an automatic checking method using box-in-box or box-in-bar alignment marks. The misalignment is compensated based on the result of the measurement.

Now, a conventional method for measuring an overlay in a semiconductor device will be described in conjunction with FIGS. 1 to 3.

FIGS. 1 and 2 are plan views of light exposure masks used to form outer and inner mark portions of an overlay measuring mark in accordance with the prior art, respectively. On the other hand, FIG. 3 is a layout view illustrating a semiconductor wafer provided with the overlay measuring mark formed using the light exposure masks of FIGS. 1 and 2 in accordance with a conventional method.

In accordance with the conventional method, a light exposure mask 1 for the outer mark portion of the overlay measuring mark is formed by arranging a ring-shaped photo shield film pattern 3 on a transparent substrate 2, as shown in FIG. 1. Thereafter, another light exposure mask 11, which is used to form the inner mark portion of the overlay measuring mark, is formed by arranging a square photo shield film pattern 13 on a transparent substrate 12, as shown in FIG. 2.

Meanwhile, a semiconductor wafer 21 is prepared, and an etch layer for the overlay measuring mark is then coated over the semiconductor wafer 21, as shown in FIG. 3. The etch layer is then etched using a positive photoresist film pattern as a mask, thereby forming an outer mark 22 consisting of a square ring-shaped etch layer pattern. The photoresist film pattern is formed by forming a photoresist film over the etch layer, exposing the photoresist film to light by use of the light exposure mask 1 shown in FIG. 1, and developing the photoresist film (not shown). On the semiconductor wafer 21, a square column-shaped inner mark 23 comprised of a positive photoresist film pattern is formed on the inside of the outer mark 22. The photoresist film pattern for the inner mark 23 is formed by forming a photoresist film over the etch layer, exposing the photoresist film to light by use of the light exposure mask 11 shown in FIG. 2, and developing the photoresist film (not shown).

It is possible to measure the overlay accuracy of the wafer 21 provided with the overlay measuring mark by an overlay measuring device.

Where the inner mark 23 of the conventional overlay measuring mark formed in the above-mentioned manner has vertical side walls as shown in FIG. 4, the overlay measuring device can accurately measure positions of respective edges of the inner and outer marks 23 and 22. Based on the result of the measurement, the overlay accuracy of the wafer 21 can immediately be measured. Accordingly, the overlay accuracy value can be corrected appropriately.

Where an inclined light exposure process is used in the formation of the overly measuring mark, the inner mark 23 may have an inclined shape as shown in FIG. 5 because the light exposure process becomes unstable due to light which is inclinedly irradiated.

Moreover, the semiconductor wafer 21 may be mounted on the overlay measuring device in a state inclined by an angle θ, as shown in FIG. 6. In this case, the overlay measuring device exhibits a very small variation in recognizing the position of the outer mark 22 because the outer mark 22 is comprised of a thin etch layer pattern having a small thickness. However, the overlay measuring device exhibits great variation in recognizing the position of the inner mark 23 because the inner mark 23 has a thick photoresist film pattern having a large thickness of 1 μm or more.

In the case of FIG. 5 or 6, the overlay measuring device generates a position recognition error of δx (FIG. 7a) because it recognizes a pattern based on a variation in reflection factor. For example, the overlay measuring device may erroneously recognize the position of the inner mark 23 in such a manner that the inner mark 23 is defined between its left upper edge 23a and right lower edge 23d (FIG. 7b) nevertheless the actual size of the inner mark 23 should be defined by the upper edges 23a and 23c or lower edges 23b and 23d.

When the inner mark is inclinedly formed or the semiconductor wafer is inclinedly mounted, accordingly, it is required to compensate the recognition error resulting from the inclination. To this end, a tool induced shift (TIS) process is mainly used. In accordance with the TIS process, the overlay-measured semiconductor wafer is re-mounted on the overlay measuring device in a 180°-turned state, and an overlay measurement is then conducted again.

FIG. 7 is a schematic view for explaining a conventional TIS process.

Where the semiconductor wafer 21 provided with the inner marks 23 and outer marks 22 are mounted on the overlay measuring device in a state inclined by an angle θ in an optional direction, as shown in FIG. 7, the overlay measuring device erroneously recognizes the inner mark 23 as being defined between its left upper edge 23a and right lower edge 23d at its primary overlay measurement. In this case, the difference in position between the inner marks 23 and outer marks 22 is calculated as a misalignment value. That is, the difference in position (23a–22a) between the facing edges 23a and 22a of the inner and outer marks 23 and 22 and the difference in position (23b–22b) between the facing edges 23b and 22b of the inner and outer marks 23 and 22 are calculated. However, "23b–22a" and "23d–22b" are actual misalignment values. In order to correct this error, the TIS process is conducted.

That is, the semiconductor wafer 21 is turned 180° (FIG. 7b) and then loaded in the overlay measuring device to perform an overlay measurement. Through this TIS process, "23a–22a" and "23b–22b" may be obtained. Accordingly, the error value of δx corresponding to "23a–23b" can be obtained.

The error value mentioned above is then applied to the overlay measuring device so that it can be used to compensate for the reference value which will be used in conducting an overlay measurement for other semiconductor wafers.

Thus, the above-mentioned TIS process compensates for an intrinsic error value involved in the overlay measuring device prior to the measurement of overlay. Accordingly, it is possible to increase the accuracy of overlay measurement.

However, the above-mentioned conventional method involves various problems.

For example, since the reference value corrected using the value obtained by the TIS process is continuously used without any modification at subsequent steps in accordance with the conventional overlay testing method, a variation in conditions of the overlay measuring device or semiconductor wafers, which may occur subsequently, can not be reflected in a subsequent overlay measurement. In order to obtain a reference value corrected in cope with the above-mentioned variation, the TIS process should be conducted again. However, this procedure is troublesome.

Furthermore, in the case of highly integrated semiconductor devices such as 256 Mega-grade DRAM's, the overlay measurement process should be conducted several times to obtain a newly corrected reference value.

Since one overlay measurement takes about 1 hour, it is very difficult to obtain a completely corrected reference value requiring a lot of time. As a result, the process yield and operation reliability expected by the measurement of overlay are reduced.

SUMMARY OF THE INVENTION

Therefore, an object of the invention is to solve the above-mentioned problems involved in the prior art and to provide a method for testing an overlay in a semiconductor device, capable of accurately measuring an overlay correction value by performing the measurement of overlay only one time, thereby simplifying the overall overlay measurement process.

Another object of the invention is to provide a method for testing an overlay in a semiconductor device, capable of obtaining an increased overlay measurement margin, thereby achieving an improvement in process yield and operation reliability.

Another object of the invention is to provide a method for testing an overlay in a semiconductor device, which can be appropriately used in the fabrication of highly integrated semiconductor devices.

In accordance with one aspect of the present invention, a method for testing an overlay in a semiconductor device comprises the steps of: forming an outer mark comprised of an etch layer pattern on a semiconductor wafer; forming an inner mark on the semiconductor wafer in such a fashion that the inner mark is inclined in one direction and has an island portion arranged on the inside of the outer mark and a land portion comprised of a photoresist film pattern formed over the entire surface of the semiconductor wafer while spacing from the island portion by a desired distance, thereby forming an overlay measuring mark consisting of the inner and outer marks; testing the overlay measuring mark, thereby deriving position values of edges of the island portion measured at opposite lower edges of the island portion and position values of edges of the land portion measured at opposite lower edges of the land portion; and deriving respective mean values of the position values, correcting measured coordinates obtained by an overlay measuring device by the derived mean values, and conducting an overlay alignment using the corrected coordinates as coordinates of the inner mark.

In accordance with another aspect of the present invention, a method for testing an overlay in a semiconductor device comprises the steps of: forming an inner mark comprised of an etch layer pattern on a semiconductor wafer; forming an outer mark on the semiconductor wafer in such a fashion that the outer mark is inclined in one direction and has an island portion arranged on the inside of the inner mark and a land portion comprised of a photoresist film pattern formed over the entire surface of the semiconductor wafer while being spaced from the island portion by a desired distance, thereby forming an overlay measuring mark consisting of the inner and outer marks; testing the overlay measuring mark, thereby deriving position values of edges of the island portion measured at opposite lower edges of the island portion and position values of edges of the land portion measured at opposite lower edges of the land portion; and deriving respective mean values of the position values, correcting measured coordinates obtained by an overlay measuring device by the derived mean values, and conducting an overlay alignment using the corrected coordinates as coordinates of the outer mark.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 8:
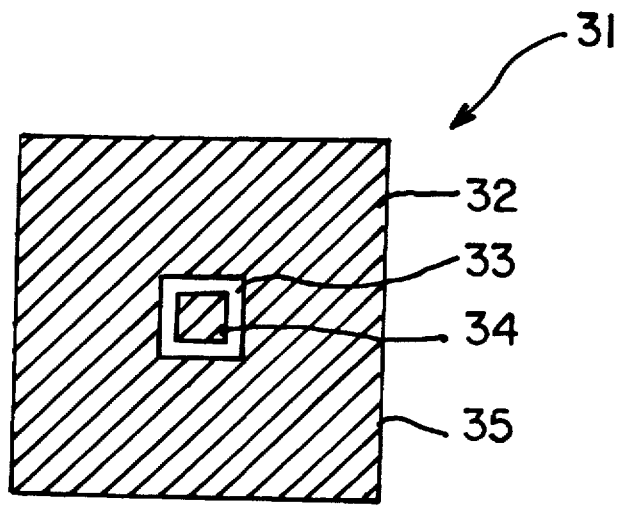
FIG. 8 is a plan view illustrating a light exposure mask used to form an inner mark portion of an overlay measuring mark in accordance with an embodiment of the present invention.

FIG. 8 illustrates a light exposure mask used to form the inner mark portion of an overlay measuring mark in accordance with the present invention.

As shown in FIG. 8, the light exposure mask, which is denoted by the reference numeral 31, includes a transparent substrate 32, an inner photo shield film pattern 34 formed on the transparent substrate 32 and an outer photo shield film pattern 35 formed on the transparent substrate 32 in the outside of the inner photo shield film pattern 34. A ring-shaped light exposure region 33 having a width d of about 0.05 to 2 μm is defined between the inner and outer photo shield film patterns 34 and 35. The light exposure region 33 has a length which is adjustable in accordance with the size of the outer mark portion of the overlay measuring mark. Preferably, the light exposure region 33 has a length of 3 to 5 μm corresponding to the size of a typical inner mark.

The width d of the light exposure region 33 corresponds to 1 to 15 times the wavelength λ used in the light source of a stepper as used.

Figure 1:
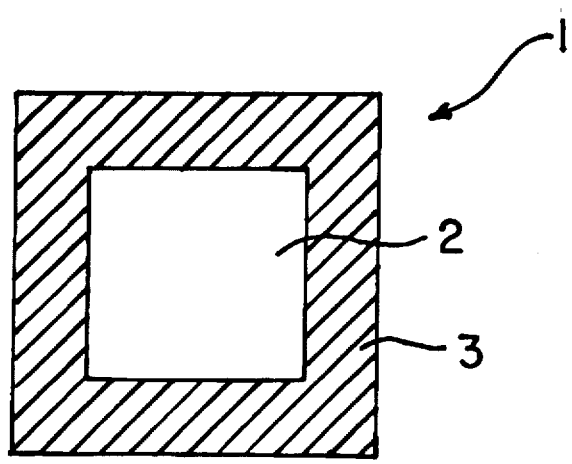
FIG. 1 is a plan view of a light exposure mask used to form an outer mark portion of an overlay measuring mark in accordance with the prior art.
Figure 2:
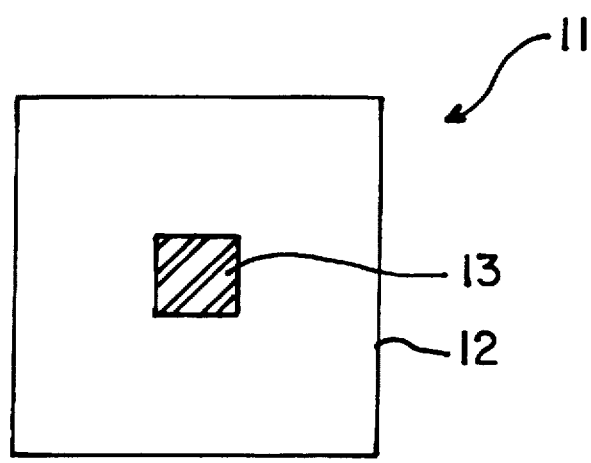
FIG. 2 is a plan view of a light exposure mask used to form an inner mark portion of an overlay measuring mark in accordance with the prior art.
Figure 3:
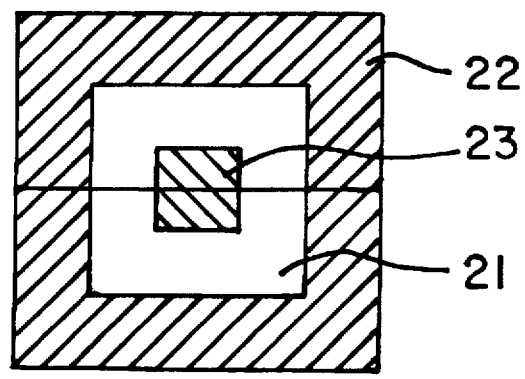
FIG. 3 is a layout view illustrating a semiconductor wafer provided with an overlay measuring mark formed using the light exposure masks of FIGS. 1 and 2 in accordance with a conventional method.
Figure 4:
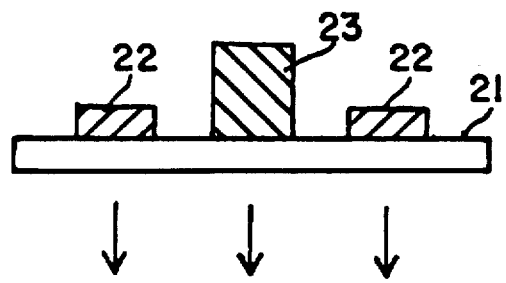
FIG. 4 is a sectional view illustrating a semiconductor wafer formed with an overlay measuring mark in accordance with a conventional method.
Figure 5:
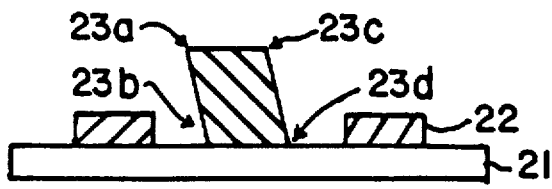
FIG. 5 is a sectional view illustrating a semiconductor wafer formed with an overlay measuring mark in accordance with another conventional method.
Figure 6:
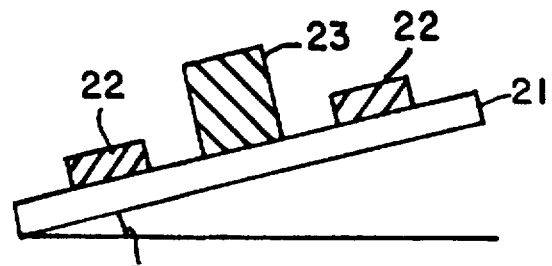
FIG. 6 is a sectional view illustrating the semiconductor wafer of FIG. 4 mounted on an overlay measuring device in a state inclined by an angle θ.
Figure 7A:
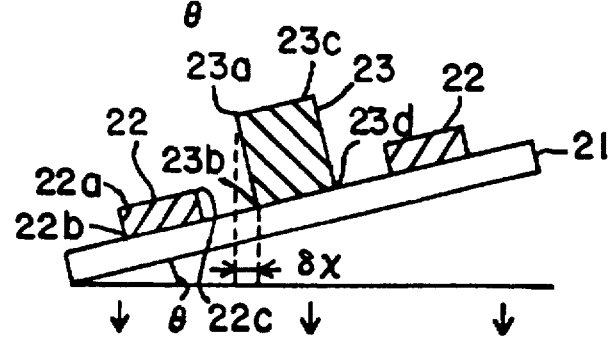
FIGS. 7a and 7b are schematic views for explaining a conventional TIS process.
Figure 7B:
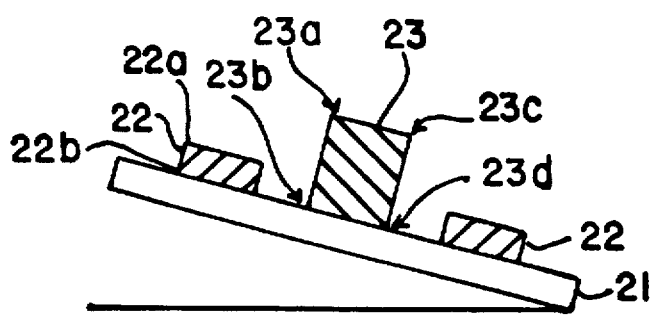
Figure 9:
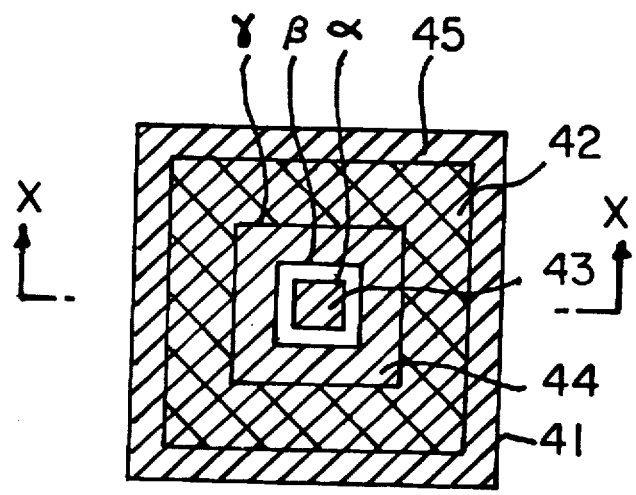
FIG. 9 is a layout view illustrating a semiconductor wafer formed with an overlay measuring mark using the light exposure mask of FIG. 8 in accordance with the present invention.

In order to form the overlay measuring mark on a semiconductor wafer, an etch layer (not shown) is first coated over the semiconductor wafer which is denoted by the reference numeral 41 in FIG. 9. The etch layer is then etched using a positive photoresist film pattern as a mask, thereby forming an outer mark 42 having a square ring-shaped etch layer pattern, as shown in FIG. 9. The photoresist film pattern is formed by depositing a photoresist film over the semiconductor wafer, exposing the photoresist film to light using the light exposure mask 1 shown in FIG. 1, and developing the light-exposed photoresist film.

Figure 10:
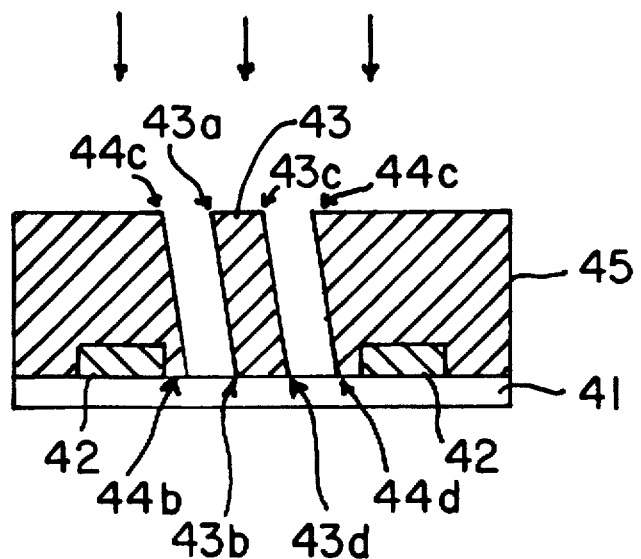
FIG. 10 is a cross-sectional view taken along the line X—X of FIG. 9.

Thereafter, another positive photoresist film 45 is coated over the entire exposed surface of the resulting structure. The photoresist film 45 is then exposed to light using the light exposure mask 31 shown in FIG. 8 and developed, thereby forming an inner mark consisting of photoresist film patterns shown in FIG. 10. As shown in FIG. 10, the inner mark includes an island portion 43 inwardly spaced apart from the outer mark 42 by a desired width, and a land portion 44 coated over the entire upper surface of the semiconductor wafer around the island portion 43 while being spaced from the island portion 43 by a desired width. Thus, an overlay measuring mark is obtained.

In order to measure an overlay in the semiconductor wafer 41 having the above-mentioned structure, the semiconductor wafer 41 is loaded in an overlay measuring device. In this case, opposite edges 42a and 42b of the outer mark 42 can be accurately measured.

Where the inner mark is formed to have inclined side walls, side edges 43a and 43d of the island portion 43 are detected as opposite edges of the island portion 43 while side edges 44b and 44c of the land portion 44 are detected as opposite edges of the land portion 44. In this case, accordingly, coordinates of the side edges 43a and 43d of the island portion 43 and coordinates of the side edges 44b and 44c of the land portion 44 are detected.

Thereafter, the difference in position between the island and land portions 43 and 44 of the inner mark is calculated to derive the coordinates of the inner mark. That is, a mean value IL between position values of the facing edges 44b and 43a on left side and a mean value IR between position values of the facing edges 44c and 43d on right side are calculated. These mean values IL and IR are recognized as new position values of the inner mark. Using these position values of the inner mark as a reference, the space between the inner and outer marks is measured, thereby conducting a compensation of overlay.

Now, the calculation of compensation values will be described in detail.

First, image position data $X_1$ and $Y_1$ about the edge γ in the structure provided with the inner marks(43) (44) and outer mark(42) as shown in FIG. 9 are calculated. Thereafter, position data $X_2$ and $Y_2$ about the edge α as subsequently read and position data $X_3$ and $Y_3$ about the edge β as subsequently read are derived. The mean value "$(X_2+X_3)/2$" between position values $X_2$ and $X_3$ and the mean value "$(Y_2+Y_3)/2$" between position values $Y_2$ and $Y_3$ are calculated using a computer. Based on these mean values, misalignment values δx and δy of the edge γ are calculated. That is, the misalignment values δx and δy are calculated by deducting position values $X_1$ and $Y_1$ respectively from the associated mean values as follows:

$$\delta x = (X_2+X_3)/2 - X_1$$

$$\delta y = (Y_2+Y_3)/2 - Y_1$$

In the above case, the inner mark consists of island and land portions.

Figure 11:
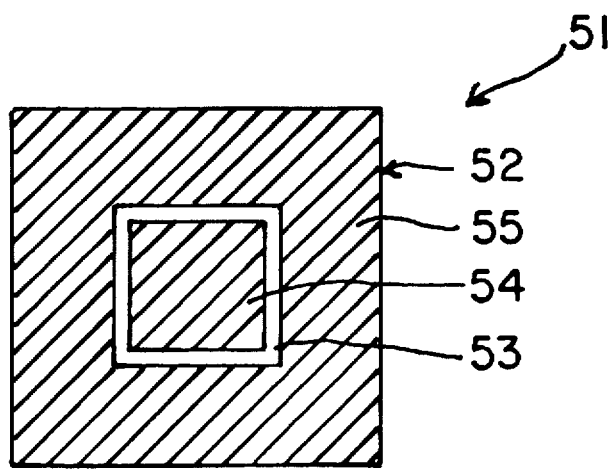
FIG. 11 is a plan view illustrating a light exposure mask used to form an outer mark portion of an overlay measuring mark in accordance with another embodiment of the present invention.

The inner mark may be comprised of a thin film pattern. In this case, the outer mark consists of island and land portions. In order to form such an overlay measuring mask, a light exposure mask 51 shown in FIG. 11 may be used, which includes a photo shield film pattern 54.

Where the inner mark is comprised of a negative photoresist film, the photo shield film pattern of the light exposure mask should have a ring shape. In this case, the photo shield film pattern formed on the wafer has a size of about 1 μm or more, thereby preventing it from collapsing.

As is apparent from the above description, the method for testing an overlay in a semiconductor device in accordance with the present invention provides various effects.

For example, even if the overlay measuring mark is formed in an inclined state, the method of the present invention can simply measure an inaccuracy in measured overlay value because the inner mark of the overlay measuring mark consists of an island portion and a land portion covering the entire surface of the semiconductor wafer. Measured values of the island and land portions are averaged and then compared with measured values of the outer mark of the overlay measuring mark, thereby deriving overlay compensation values. Based on these overlay compensation values, an inaccuracy in measured overlay value can be easily compensated for.

Even when the overlay correction value varies subsequently due to a variation in conditions of the overlay measuring device or process, an accurate overlay correction value can be derived by conducting the overlay measuring process only once.

Accordingly, the overlay margin in the overlay test may be increased, thereby improving process yield and operation reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for testing an overlay in a semiconductor device, comprising the steps of:

forming an outer mark having edges, wherein the outer mark is comprised of an etch layer pattern on a semiconductor wafer;

forming an inner mark having edges on the semiconductor wafer in such a fashion that the inner mark is inclined in one direction and has an island portion arranged on the inside of the outer mark and a land portion comprised of a photoresist film pattern formed over the entire surface of the semiconductor wafer while being spaced from the island portion by a desired distance, thereby forming an overlay measuring mark consisting of the inner and outer marks;

testing the overlay measuring mark, thereby deriving position values of the edges of the island portion and position values of the edges of the land portion; and deriving respective mean values of the position values, correcting measured coordinates obtained by an overlay measuring device by the derived mean values, and conducting an overlay alignment using the corrected coordinates as coordinates of the inner mark.

2. The method in accordance with claim 1, wherein the outer mark has a square ring shape.

3. The method in accordance with claim 2, wherein when the inner mark is comprised of a negative photoresist film, the outer mark has a size of at least 1 µm at its ring-shaped portion so as to prevent the photoresist film from collapsing.

4. The method in accordance with claim 1, wherein the island portion has a square shape.

5. The method in accordance with claim 1, wherein the island and land portion of the inner mark are spaced from each other by a distance of about 0.05 to 2 µm.

6. The method in accordance with claim 1, wherein the island and land portion of the inner mark are spaced from each other by a distance corresponding to about 1 to 15 times the wavelength used in the light source of a stepper as used.

7. The method in accordance with claim 1, wherein the corrected values based on the overlay measuring mark is obtained by deriving image position data in X and Y directions deriving image position data ($X_1$ and $Y_1$) of the outer mark and first image position data ($X_2$ and $Y_2$) and second image position data ($X_3$ and $Y_3$) of the inner mark, calculating a mean value (($X_2+X_3$)/2) between the position values ($X_2$ and $X_3$) of the inner mark and a mean value (($Y_2+Y_3$)/2) between position values ($Y_2$ and $Y_3$) of the inner mark, and deducting the position values ($X_1$ and $Y_1$) of the outer mark respectively from the associated mean values, thereby obtaining misalignment values ($\delta x$ and $\delta y$) ($\delta x=(X_2+X_3)/2-X_1$; and $\delta y=(Y_2+Y_3)/2-Y_1$).

8. A method for testing an overlay in a semiconductor device to obtain corrected coordinates of an inner mark and an outer mark, comprising the steps of:

forming the inner mark having edges, wherein the inner mark is comprised of an etch layer pattern on a semiconductor wafer;

forming the outer mark having edges on the semiconductor wafer in such a fashion that the outer mark is inclined in one direction and has an island portion arranged on the inside of the outer mark and a land portion comprised of a photoresist film pattern formed over the entire surface of the semiconductor wafer while being spaced from the island portion by a desired distance, thereby forming an overlay measuring mark consisting of the inner and outer marks;

testing the overlay measuring mark, thereby deriving position values of the edges of the island portion and position values of the edges of the land portion; and deriving respective mean values of the position values, correcting measured coordinates obtained by an overlay measuring device by the derived mean values, and conducting an overlay alignment using the corrected coordinates as coordinates of the inner mark.

9. The method in accordance with claim 8, wherein the inner mark has a square ring shape.

10. The method in accordance with claim 9, wherein when the outer mark is comprised of a negative photoresist film, the inner mark has a size of at about 1 µm at its ring-shaped portion so as to prevent the photoresist film from collapsing.

11. The method in accordance with claim 8, wherein the island portion has a square shape.

12. The method in accordance with claim 8, wherein the island and land portion of the outer mark are spaced from each other by a distance of about 0.05 to 2 µm.

13. The method in accordance with claim 8, wherein the island and land portion of the outer mark are spaced from each other by a distance corresponding to about 1 to 15 times the wavelength used in the light source of a stepper as used.

14. The method in accordance with claim 8, wherein the corrected values based on the overlay measuring mark is obtained by deriving image position data in X and Y directions deriving image position data ($X_1$ and $Y_1$) of the outer mark and first image position data ($X_2$ and $Y_2$) and second image position data ($X_3$ and $Y_3$) of the inner mark, calculating a mean value (($X_2+X_3$)/2) between the position values ($X_2$ and $X_3$) of the inner mark and a mean value (($Y_2+Y_3$)/2) between position values ($Y_2$ and $Y_3$) of the inner mark, and deducting the position values ($X_1$ and $Y_1$) of the outer mark respectively from the associated mean values, thereby obtaining misalignment values ($\delta x$ and $\delta y$) ($\delta x=(X_2+X_3)/2-X_1$; and $\delta y=(Y_2+Y_3)/2-Y_1$).

* * * * *